United States Patent [19]

Ely

[11] Patent Number: 4,703,199
[45] Date of Patent: Oct. 27, 1987

[54] NON-RESTRICTED LEVEL SHIFTER

[75] Inventor: Glenn L. Ely, San Jose, Calif.

[73] Assignee: Intersil, Inc., Cupertino, Calif.

[21] Appl. No.: 719,478

[22] Filed: Apr. 3, 1985

[51] Int. Cl.$^4$ .................... H03K 19/00; H03K 19/08
[52] U.S. Cl. .................................. 307/264; 307/475; 307/297
[58] Field of Search ............ 307/264, 297, 475, 491, 307/497; 328/172

[56] References Cited

U.S. PATENT DOCUMENTS

| 4,029,973 | 6/1977 | Kobayashi et al. ............... 307/264 |
| 4,039,862 | 8/1977 | Dingwall et al. ............... 307/247 R |

FOREIGN PATENT DOCUMENTS 118326 10/1974 Japan .
150955 11/1979 Japan .
122222 7/1984 Japan .
216327 12/1984 Japan .

Primary Examiner—Stanley D. Miller
Assistant Examiner—Richard Roseen
Attorney, Agent, or Firm—S. C. Corwin; B. E. Morris; H. I. Schanzer

[57] ABSTRACT

A high frequency CMOS voltage level shifter providing either an inverted or noninverted signal output shifted in voltage level from an input signal. The level shifter includes two pairs of metal oxide semiconductor transistors with the transistors of each pair connected together and respectively connected to a first and second voltage source. The gates of a transistor in each pair are cross connected to the interconnected drains of the opposing transistor pair. First and second conducting elements are respectively connected to the cross connected transistor gates to discharge a transient capacitive gate charge present during output signal voltage level shifting.

12 Claims, 5 Drawing Figures

NON-RESTRICTED LEVEL SHIFTER

BACKGROUND OF THE INVENTION

1. Field of the Invention

The present invention relates to digital level shifters and more particularly to CMOS level shifters.

2. Description of the Prior Art

Level shifters typically provide an output signal shifted in voltage level from an input signal voltage level. A wide variety of digital electronic devices employ level shifters to shift the voltage levels at which logic functions are conducted by various circuits within the device. Due to a number of economic and design considerations some circuits such as, for example, timing circuits may employ relatively low voltage levels to represent logical LOW or HIGH signal values while other circuits such as, for example, erasable programmable read-only memories (EPROMs) may require generally higher voltage levels (for example, to inject electrons into a floating gate in order to program the EPROM). Level shifters can provide a suitable interface between circuits operating a different voltage levels thereby obviating the need to design all of the circuits to operate at the same voltage levels. A savings in the total amount of power dissipated by a digital electronic device can be obtained by operating some of the circuits at lower voltage levels.

Level shifters can be configured in a number of different circuits and incorporate several different transistor design technologies. Typically, level shifters incorporating CMOS transistor designs provide a greater savings in power consumption over circuit designs incorporating p-channel transistors, n-channel transistors, or bipolar transistors alone. CMOS level shifters, however, suffer from a relatively slow output signal transition speed which generally limits their operating frequency to the kilohertz region.

One type of prior art CMOS level shifter incorporates two pairs of complementary metal oxide semiconductor transistors with each pair having a first and second transistor of opposite conductivity type connected together and respectively connected to a first and second voltage source. The gates of the p-channel transistors in each pair are bridged by a signal inverter and the gates of the n-channel transistors in each pair are cross connected to the transistor interconnection of the opposing transistor pair. An input signal is provided to the gate of the first pair p-channel transistor and an inverted or non-inverted output signal may be derived from the transistor interconnections of the first and second transistor pairs respectively.

In an initial state, the p-channel transistor of one pair and the n-channel transistor of the opposing pair are in a conducting or "of" state, and the opposite p-channel and n-channel transistors in a non-conducting or "off" state. When the input signal voltage level shifts, the first two transistors will turn off and the other p-channel transistor and opposing transistor pair n-channel transistor will turn on. During the transition, however, the p-channel transistors will switch conducting states more quickly than the n-channel transistors, resulting in the final conducting state p-channel transistor pulling up against the drain of its paired n-channel transistor until the voltage level between the two transistors changes sufficiently to turn on the opposing pair n-channel transistor. This complementary transistor pair transition phase draining characteristic places a severe restriction on the size ratios of the complementary tansistors in each pair and also restricts the operating frequency of the level shifter. Transition phase draining also increases the transient power consumption of the CMOS level shifter.

Thus there exists a need for a faster CMOS level shifter in which transistor pair transition phase draining is minimized.

SUMMARY OF THE INVENTION

The present invention provides a novel CMOS level shifter in which complementary transistor pair transition phase draining is minimized. The present inventive level shifter is therefore able to quickly switch between output signal voltage levels with minimal transient power consumption.

In general terms the circuit, in its several presently preferred embodiments, includes a comlementary MOS transistor pair level shifter with various novel discharging circuits connected to the gates of the cross connected transistors of each complementary pair. The discharging circuits drain a capacitive gate charge present on the cross connected transistors at the onset of signal transition. To minimize transient power consumption, these discharging circuits may be configured to operate only briefly during the onset of output signal transition.

The novel features which are believed to be characteristic of the present invention will be better understood from the following detailed description, considered in connection with the accompanying drawings, wherein various circuits embodying the present invention are described and in which like numbers denote like elements.

DETAILED DESCRPTION OF THE INVENTION

Figure 1:
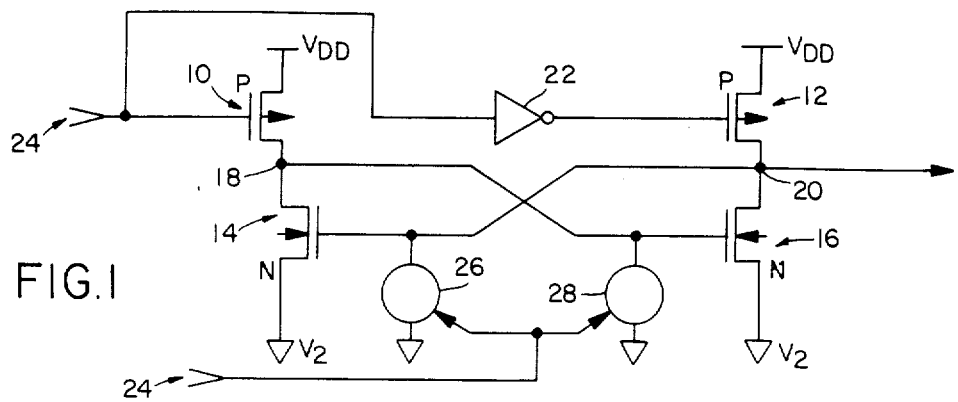
FIG. 1 is a schematic diagram of a generalized circuit embodying the present inventive circuit.

Referring to the figures, and more particularly FIG. 1 thereof, there is shown a generalized schematic diagram of one embodiment of the present inventive level shifter. The level shifter includes a first and second pair of complementary metal oxide semiconductor (CMOS) transistors having p-channel transistors 10, 12 respectively connected to n-channel transistors 14, 16 at nodes 18, 20. The sources of transistors 10, 12 are connected to a first voltage source providing a voltage level $V_{DD}$ and the sources of transistors 14, 16 are connected to a second voltage source providing a voltage level $V_2$. Typically $V_2$ is a lower voltage level than $V_{DD}$. A signal inverter 22 is connected across the gates of transistors 10, 12 while the gates of transistors 14, 16 are respectively cross connected to the opposing complementary transistor pair nodes 20, 18. A signal input 24 providing a digital input signal varying between $V_{DD}$ and a voltage level $V_1$ is applied to the gate of the transistor 10. Typically $V_1$ is a lower voltage level than $V_{DD}$. An output signal varying between voltage levels $V_{DD}$ and $V_2$ may be obtained at either of nodes 18 or 20.

In operation, with an input signal at voltage level $V_{DD}$, p-channel transistor 10 and n-channel tansistor 16 will be in a nonconducting or "off" state while the p-channel transistor 12 and n-channel transistor 14 will be in a conducting or "on" state. An output signal obtained from node 20 will be at voltage level $V_{DD}$ and an output signal obtained from node 18 will be inverted at voltage level $V_2$. When the input signal voltage level shifts from $V_{DD}$ to $V_1$, transistors 10 and 16 turn on while transistors 12 and 14 turn off. The output signal voltage level at node 20 will now be level shifted to $V_2$ and the inverted signal output voltage level at node 18 will be level shifted to $V_{DD}$.

At the onset of input signal transition from $V_{DD}$ to $V_1$, after transistor 10 has turned on and transistor 12 turned off, the gate of the transistor 14 will be floating at approximately $V_{DD}$ due to a capacitive charge remaining on the gate. Transistor 14 may therefore potentially remain on, requiring transistor 10 to pull up against the drain of transistor 14 in order to turn on transistor 16. When transistor 16 turns on, the gate of transistor 14 will drop to $V_2$ and transistor 14 will turn off. Similarly, at the onset of input signal transition from $V_1$ back to $V_{DD}$, after transistor 12 has turned on and transistor 10 turned off, the gate of transistor 16 will be floating at approximately $V_{DD}$ due to a capacitive charge remaining on the gate. At this point transistor 16 may potentially remain on requiring transistor 12 to pull up against the drain of transistor 16 in order to turn on transistor 14.

To allow the p-channel transistors 10, 12 to rapidly turn on the opposing complementary pair n-channel transistors 16, 14 during output signal transition, first and second conducting devices 26, 28 are respectively connected to the gates of transistors 14, 16. At the onset of input signal transition from $V_{DD}$ to $V_1$, conducting device 26 activates to discharge a portion of the capacitive gate charge of transistor 14 allowing transistor 10 to rapidly pull the gate of transistor 16 up to $V_{DD}$ and turn on transistor 16. Similarly, at the onset of an input signal transition from $V_1$ to $V_{DD}$ conducting device 28 activates to discharge the capacitive gate charge of transistor 16 thereby allowing transistor 12 to rapidly pull the gate of transistor 14 up to $V_{DD}$ and turn on transistor 14. Conducting devices 26, 28 may but do not necessarily need to completely turn off the respective n-channel trasistors 10, 12.

The conducting devices 26, 28 may be connected to any voltage source having an output voltage lower than the potential of the capacitive charge remaining on the gates of the n-channel transistors during an input signal transition. This potential is approximately $V_{DD}$. Since $V_2$ is typically lower than $V_{DD}$ conducting devices 26, 28 may be connected to the second voltage source supplying $V_2$. Alternatively, since $V_1$ is also typically lower than $V_{DD}$ the conducting device 26 may be connected to the signal input 24 and the conducting device 28 connected to the output of the inverter 22.

Since the interval during which the p-channel transistors 10, 12 pull up against the drain of the complementary n-channel transistors 14, 16 is minimized the geometry of the respective transistors in each complementary transistor pair 10, 14 and 12, 16 may be approximately the same. The overall output signal transition speed of the present inventive level shifter is also substantially enhanced. In one embodiment discussed more fully below, a level shifter operating frequency of several megahertz has been achieved. Transient power consumption in the present inventive level shifter may also be minimized by operating the conducting devices 26, 28 for only a brief period to discharge a portion of the capacitive gate charges of the transistors 14, 16 sufficient to substantially decrease the conductivity of the transistors.

The conducting devices 26, 28 may be embodied in the number of different circuits. FIGS. 2-5 show several preferred embodiments of the present inventive level shifter employing different embodiments of the conducting devices 26, 28. In each of these figures the same pairs of complementary p-channel and n-channel metal oxide semiconductor transistors 10, 14 and 12, 16 respectively, and the signal inverter 22 are employed.

Figure 2:
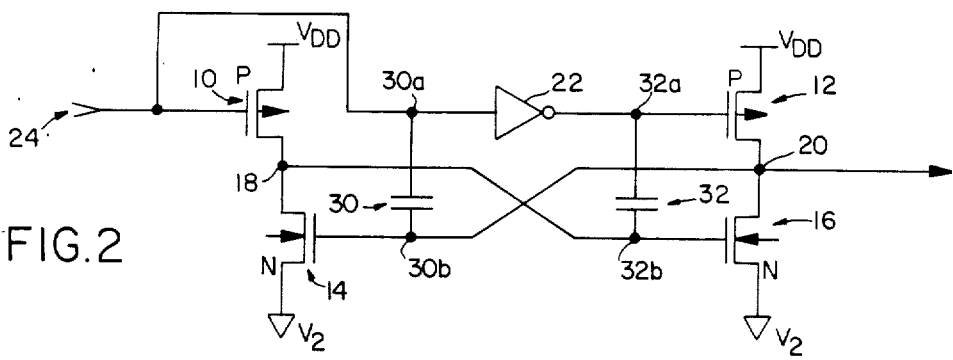
FIG. 2 is a schematic diagram of a preferred embodiment of the present inventive circuit.

In FIG. 2 one preferred embodiment of the present inventive level shifter is shown with capacitors 30, 32 acting as the conducting devices 26, 28. The capacitors 30, 32 are respectively connected across the gates of each transistor pair 10, 14 and 12, 16.

In operation, with an input signal at $V_{DD}$, a node 30a of capacitor 30 which is connected to the gate of transistor 10 and signal input 24 is at $V_{DD}$. A node 30b of capacitor 30 which is connected to the gate of transistor 14 and node 20 is also at $V_{DD}$ (since transistor 12 is on node 20 is therefore at $V_{DD}$). When the input signal voltage level shifts to $V_1$, transistor 12 will turn off and both the gate of transistor 14 and capacitor node 30b will float at $V_{DD}$. The capacitor node 30a, however, will be at the input signal voltage level $V_1$ thus providing a voltage differential across capacitor 30. The value of capacitor 30 may be selected to rapidly drain a quantity of the capacitive gate charge on transistor 14 thereby greatly reducing the conductivity of transistor 14. This allows transistor 10 to quickly pull node 18 and the gate of transistor 16 sufficiently towards to turn on transistor 16. This in turn brings node 20 and the gate of transistor 14 down to $V_2$ thereby fully turning off transistor 14.

Capacitor 32 acts similarly with respect to transistors 12 and 16. An input signal transition from $V_1$ back to $V_{DD}$ turns off transistor 10 thereby floating the gate of transistor 16 and a node 32b of capacitor 32 connected to the gate of transistor 16. A node 32a of capacitor 32 connected to the gate of transistor 12, however, will be at $V_1$ due to inverter 24. The capacitive charge on the gate of transistor 16 will thus be partially drained by capacitor 32 thereby allowing transistor 12 to more quickly pull the gate of transistor 14 up to $V_1$, thus turning transistor 14 on and turning transistor 16 off.

Use of capacitors 30, 32 as conducting devices 26, 28 can substantially increase the operating frequency of the present inventive level shifter and minimize its transient power consumption. The output signal transition speed of the level shifter, however, is dependent upon the rate at which capacitors 30, 32 drain the transient capacitive gate charges of transistors 14, 16 and, consequently the capacitive values of capacitors 30, 32 themselves. The capacitors 30, 32 may be either fabricated as part of an integrated level shifter circuit or as discrete elements.

Figure 3:
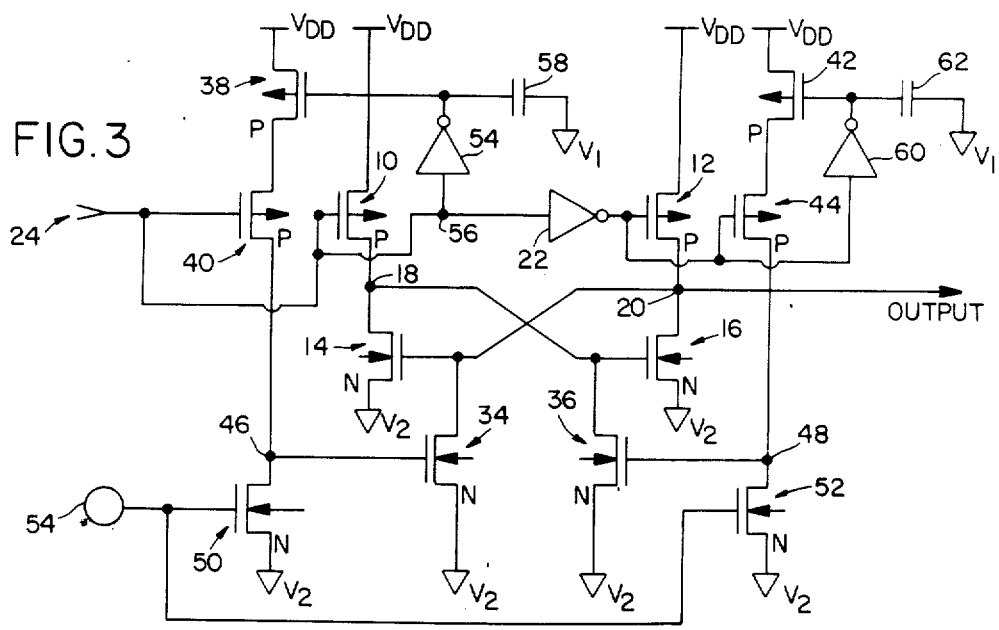
FIG. 3 is a schematic diagram of another preferred embodiment of the present inventive circuit.
Figure 4:
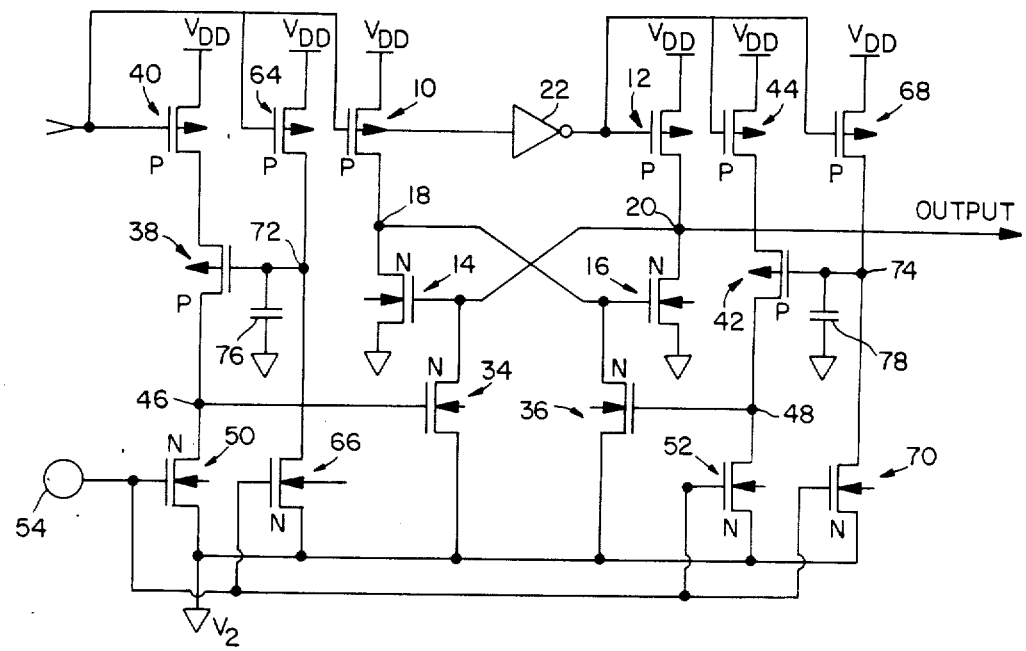
FIG. 4 is a schematic diagram of still another preferred embodiment of the present inventive circuit.
Figure 5:
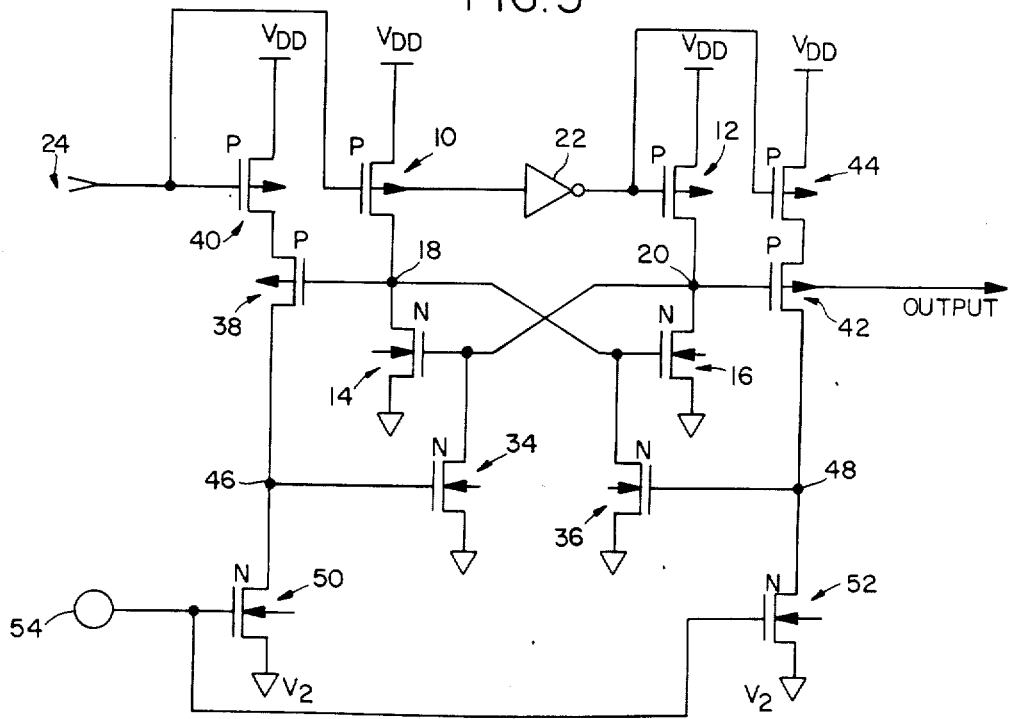
FIG. 5 is a schematic diagram of yet another preferred embodiment of the present inventive circuit.

In FIGS. 3-5 alternative embodiments of the present inventive level shifter are shown employing n-channel metal oxide semiconductor (MOS) transistors 34, 36 as the conductive devices 26, 28. In each of these embodiments transistors 34, 36 are respectively connected across the gates of transistors 14, 16 and the second voltage source at level $V_2$ to discharge the transient capacitive gate charge of transistors 14, 16 during output signal transistion. The method of turning the discharging transistors 34, 36 on and off, however, differs in each embodiment.

In the embodiment shown in FIG. 3, two p-channel transistors 38, 40 are used to switch discharging transistor 34 on and off and two p-channel transistors 42, 44 are used to switch discharging transistor 36 on and off. Transistors 38 and 40 are connected together with the source of either transistor connected to the first voltage source at $V_{DD}$ and the drain of the other transistor connected at node 46 to the gate of transistor 36. Similarly, transistors 42 and 44 are connected together with the source of either transistor also connected to the first voltage source and the drain of the other tansistor connected at node 48 to the gate of transistor 36. Switching transistor pairs 38, 40 and 42, 44 thus provide switchable conducting paths between the respective gates of the discharging transistors 32, 36 and the first voltage source at $V_{DD}$.

Two n-channel transistors 50, 52 are respectively connected across nodes 46, 48 and the second voltage source at $V_2$. Transistors 50, 52 serve as resistive elements to minimize current flow through the switching transistor pairs 38, 40 and 42, 44. The gates of transistors 50, 52 are connected at node 54 to a conventional high impedance constant voltage source which supplies a voltage approximating the threshold voltage levels of transistors 50, 52. Transistors 50, 52 thus provide a high impedance conducting path between the second voltage source at $V_2$ and the respective switching transistor pairs 38, 40 and 44, 42 connected to the first voltage source at $V_{DD}$. Typically the impedance of transistors 50, 52 is on the order of 1-10 megahoms. High impedance constant voltage sources are well known in the prior art. Current mirrors are a common voltage source of this type.

Transistors 50, 52 could be replaced by any suitable resistive element. Since the entire level shifter of the present invention could be manufactured as a single monolithic circuit, transistors 50, 52 could, for example, be replaced by a pair of integrated circuit thick or thin film resistive elements such as polysilicon load elements.

The operation of the switching transistor pair 38, 40 is controlled by connecting the gate of transistor 40 to the signal input 24 and connecting the gate of transistor 38 to the output of a signal inverter 54. The inverter 54 has an input connected at node 56 to the signal input 24 and provides an inverted signal output varying between the input signal voltage levels $V_{DD}$ and $V_1$. A capacitive element 58 is connected across the output of inverter 54 and a third voltage source supplying a voltage at $V_1$. Similarly, the operation of the switching transistor pair 42, 44 is controlled by connecting the gate of transistor 44 to the output of the inverter 22 and connecting the gate of transistor 40 to the output of a singal inverter 60. The inverter 60 has an input connected to the output of inverter 22 and also supplies an inverted output signal varying between $V_{DD}$ and $V_1$. A capacitive element 62 is similarly connected across the third voltage source at $V_1$ and the output of inverter 60.

In operation, with an input signal at $V_{DD}$, transistors 10, 16 will be turned off and transistors 12, 14 will be turned on as discussed before. Transistor 40 will be turned off and transistor 38 will be turned on with the gate of tansistor 38 and both sides of capacitor 58 at $V_1$. With transistor 40 turned off, transistor 34 will also be turned off with its gate pulled towards $V_2$ by transistor 50. Transistor 42 will be turned on due to inverter 22 and transistor 44 will be turned off with its gate at approximately $V_{DD}$ due to inverter 60. Capacitor 62 will have a differential voltage of approximately $V_{DD}$ minus $V_1$.

When the input signal shifts from $V_{DD}$ to $V_1$, transistor 40 turns on and transistor 38 remains on thereby turning transistor 34 on by pulling its gate up towards $V_{DD}$. With transistor 34 on, the capacitive charge on the gate of tansistor 14 is discharged thereby allowing transistor 10 to more rapidly turn on transistor 16 which shifts the output of node 20 to $V_2$. With the signal input shift from $V_{DD}$ to $V_1$, the output from inverter 54 shifts from $V_1$ to $V_{DD}$. Transistor 38, however, will not turn off until inverter 54 has charged up capacitor 58. When transistor 38 is turned off by inverter 54, the voltage at the gate of transistor 34 will drop back towards $V_2$ thereby turning off transistor 34. The interval during which discharging transistor 34 remains on is thus determined by the charging rate of capacitor 58. The input signal shift from $V_{DD}$ to $V_1$ will also cause inverter 60 to charge up capacitor 62 and turn on transistor 42. Transistor 44, however, will be turned off due to inverter 22 thus assuring that transistor 36 remains off with its gate pulled towards $V_2$ by transistor 50.

When the input voltage level shifts from $V_1$ back to $V_{DD}$, transistor 10 will turn off and transistor 12 will turn on with the gate of transistor 16 potentially left floating at $V_{DD}$. Now however, the output from inverter 22 will turn on transistor 44 and transistor 42 will remain on thereby turning on transistor 36 by pulling its gate up towards $V_{DD}$. The capacitive charge on the gate of transistor 16 will therefore be discharged through transistor 36 allowing transistor 12 to more rapidly turn on transistor 14, thus bringing the output signal voltage level at node 20 back to $V_{DD}$. When the output from inverter 60 has charged up capacitor 62, the gate of transistor 42 will approach $V_{DD}$ thereby turning off both transistor 42 and transistor 36.

Use of transistors 34, 36 to rapidly discharge the respective transient capacitive gate charge on transistors 14, 16 has allowed this embodiment of the present inventive level shifter to operater at relatively high frequencies. For example, level shifters of this inventive embodiment have been observed to operate at frequencies as high as several megahertz. Since transistors 10, 14 (connected across the first voltage source $V_{DD}$ and the respective gates of transistors 16, 14) turn off when discharging transistors 34, 36 turn on, minimal power is consumed during output signal transition.

In the embodiment shown in FIG. 4, transistors 38, 40 and 42, 44 are again used to provide switchable conducting paths between the respective gates of discharging transistors 32, 34 and the first voltage source at $V_{DD}$. Transistors 50, 52 are also employed again as resistive loads across the gates of transistors 32, 36 and the second voltage source at $V_2$. Inverters 54, 60, however, are respectively replaced by pairs of complementary p-channel and n-channel transistors 64, 66 and 68, 70. The complementary transistors 64, 66 and 68, 70 in each pair are connected together and respectively connected to the first and second voltage sources. Transistors 66, 70 serve the same purpose of providing resistive loads as transistors 50, 52 and could similarly be replaced with conventional integrated circuit or discrete resistive elements.

The gates of transistors 38, 42 are now respectively connected at nodes 72, 74 to the drains of transistors 64, 66 and 68, 70. Transistors 64, 68 have their gates respectively connected to the signal input 24 and the output of the inverter 22. The gates of transistors 66, 70 are connected at node 54 to a high impedance constant voltage source along with transistors 50, 52. A pair of capacitors 76, 78 are respectively connected between the gates of transistors 38, 42 and the second voltage source at $V_2$.

In operation, with an input signal at $V_{DD}$, transistors 10, 40, 64 and 16 will be off while transistors 12, 44, 68 and 14 will be on. With transistor 64 off, transistor 38 will be on with its gate pulled towards $V_2$ by transistor 66. With transistor 68 on, transistor 42 will be off with its gate pulled towards $V_{DD}$ by transistor 68. This results in a differential voltage across capacitor 78. When the input signal changes from $V_{DD}$ to $V_1$, transistors 10, 40 and 64 will turn on while transistors 12, 44 and 68 turn off. With transistors 38 and 40 both on, the gate of transistor 34 will be pulled up towards $V_{DD}$ thereby turning transistor 34 on and discharging a capacitive charge on the now floating gate of transistor 14. The conductivity of transistor 14 will swiftly decrease thereby allowing transistor 10 to rapidly turn on transistor 16 thus pulling the voltage level of signal output node 20 to $V_2$.

Transistor 38 will remain on until transistor 64 charges up capacitor 72 thereby pulling the gate of transistor 38 towards $V_{DD}$. When transistor 38 turns off transistor 34 also turns off with its gate pulled back towards $V_2$ by transistor 50. When transistor 68 turns off during the input signal shift from $V_{DD}$ to $V_1$, the charge on capacitor 74 will drain off through transistor 70 thereby allowing transistor 42 to turn on. Transistor 44, however, will be off thus leaving transistor 36 off with its gate pulled towards $V_2$ by transistor 52.

When the input signal shifts back to $V_{DD}$ from $V_1$, transistor 42 will be on due to the draining of capacitor 74 through transistor 70 and transistor 44 will be turned on by inverter 22. The gate of transistor 36 will then be pulled up towards $V_{DD}$ thereby turning on transistor 36 and draining a portion of the capacitive charge on the gate of transistor 16. The conductivity of transistor 16 will swiftly decrease thus allowing transistor 12 to rapidly turn on transistor 14, shifting the output voltage level node at 20 from $V_2$ back to $V_{DD}$. With transistor 68 now turned on by inverter 22, transistor 42 will be turned off by transistor 68 charging up capacitor 74 and pulling the gate of transistor 42 towards $V_{DD}$. When transistor 42 turns off, transistor 36 will turn off with its gate pulled back towards $V_2$ by transistor 52.

The embodiment shown in FIG. 5 also employs transistors 34, 36 to respectively drain transient capacitive charges on the gates of transistors 14, 16. In this embodiment, however, a feedback control is provided between the voltage levels at the drains of transistors 14, 16 and the switching of transistors 34, 36 on or off. The p-channel transistor pairs 38, 40 and 42, 44 are again used to provide switchable conducting paths between the respective gates of the discharging transistors 34, 36 and the first voltage source. Similarly, the n-channel transistors 50, 52 are also employed as resistive loads between the second voltage source and the respective switching transistor pairs 38, 40 and 42, 44. The gates of transistors 40, 44 are again respectively connected to the signal input 24 and the output of inverter 22. The gates of transistors 38, 42, however, are now respectively connected to the output signal nodes 18, 20.

In operation, with an input signal at $V_{DD}$, transistors 10, 40 and 16 will be off while transistors 12, 44 and 14 will be on. With transistor 14 on, node 18 will be at $V_2$ and consequently transistor 38 will be on. With transistor 12 on, node 20 will be at $V_{DD}$ and consequently transistor 42 will be off. Since transistor 40 is off, transistor 34 will be off with its gate pulled towards $V_2$ by transistor 50. Since transistor 42 is off, transistor 36 will also be off with its gate pulled towards $V_2$ by transistor 52.

When the input signal shifts from $V_{DD}$ to $V_1$ transistors 10 and 40 turn on while transistors 12 and 44 turn off. Since transistors 38, 40 are now both on, transistor 34 will be turned on with its gate pulled towards $V_{DD}$. Transistor 34 will then drain the capacitive charge from the gate of transistor 14 thus allowing transistor 10 to more rapidly turn on transistor 16 which shifts the voltage level at node 20 to $V_2$. When node 20 shifts to $V_{DD}$ transistor 42 will turn on. Transistor 44, however, will be turned off due to inverter 22. Consequently transistor 36 will remain off with its gate pulled towards $V_2$ by transistor 52.

In this embodiment, transistor 34 is turned off when transistor 10, pulling against the drain of transistor 14, pulls node 18 sufficiently towards $V_{DD}$ to turn off transistor 38. Thus, the conducting state of discharging transistor 34 is controlled by the extent to which transistor 10 is able to pull against the drain of the transistor being turned off by transistor 34. This provides a control feedback on transistor 34 based on how well it has performed its task of turning transistor 14 off.

When the input signal shifts from $V_1$ back to $V_{DD}$, tansistors 42, 44 will both be on and transistor 36 will be turned on with its gate pulled towards $V_{DD}$. Transistor 36 will then drain the capacitive charge from the gate of transistor 16 thus allowing transistor 12 to more rapidly turn on transistor 14 thereby rapidly shifting node 20 back to $V_{DD}$. As node 20 approaches $V_{DD}$ transistor 42 is turned off thereby turning off transistor 36. In analogy with transistor 34, draining transistor 36 is thus controlled by the extent to which it turns off transistor 16.

It will, of course, be understood that modifications of the present invention, in its various aspects, will be apparent to those skilled in the art, some being apparent only after study and others being merely matters of routine electronic design. For example, the embodiments illustrated herein could be fabricated with the conductivity type of all of the various transistors reversed. Thus, the entire circuit could be constructed out of either an n or p doped silicon base chip. Other embodiments are also possible with their specific designs dependent upon the particular application. As such, the scope of the present invention should not be limited by the particular embodiments herein described but should be defined only by the appended claims and equivalents thereof.

What is claimed is:
1. A voltage level shifter comprising:
first and second power terminals for the application therebetween of an operating voltage;
an input terminal for the application thereto of an input signal whose amplitude is less than the amplitude of the operating voltage;
first and second output terminals for producing thereat first and second complementary signals, respectively, whose amplitude range between the voltages at said first and second power terminals;

first and second inverting means, each one of said inverting means including a first transistor of one conductivity type and a second transistor of second conductivity type; each transistor having first and second electrodes defining the ends of a conduction path and a control electrode; means connecting the conduction path of the first transistor of said first inverting means between said first power terminal and said first output terminal and the conduction path of said second transistor of said first inverting means between said first output terminal and said second power terminal; means connecting the conduction path of said first transistor of said second inverting means between said first power terminal and said second output terminal and the conduction path of said second transistor of said second inverting means between said second output terminal and said second power terminal;

means coupled between said input terminal and the control electrode of said first transistor of said first inverting means for applying thereto said input signal; and means coupled between said input terminal and the control electrode of said first transistor of said second inverting means for applying thereto the complement of said input signal;

means connecting the control electrode of the second transistor of the first inverting means to said second output terminal and the control electrode of the second transistor of the second inverting means to said first output terminal;

a first conductive means responsive to the signal applied to the control electrode of said first tranistor of said first inverting means coupled to the control electrode of said second transistor of said first inverting means for tending to turn-off said second transistor of said first inverting means when said input signal makes a transition of a polarity and magnitude to turn-on said first transistor of said first inverting means; and a second conductive means responsive to the signal applied to the control electrode of said first transistor of said second inverting means coupled to the control electrode of said second transistor of said second inverting means for tending to turn-off said second transistor of said second inverting means when said input signal makes a transition of a polarity and magnitude to turn-on said first transistor of said second inverting means.

2. The level shifter of claim 1 wherein said first conductive means comprises a first capacitive element connected between the control electrodes of said first and second transistors of said first inverting means and wherein said second conductive means comprises a second capacitive element connected between the control electrodes of said first and second transistors of said second inverting means.

3. The level shifter of claim 1 wherein said first conductive means comprises:

a first discharging transistor having a conduction path and a control electrode, the conduction path of said first discharging transistor being coupled between the control electrode of said second transistor of said first inverting means and said second power terminal; and first switching means responsive to said input signal, connected to the control electrode of said first discharging transistor, for turning on said first discharging transistor when said input signal makes a transition so as to turn on said first transistor of said first inverting means and for turning off said first discharging transistor a predetermined time layer; and wherein said second conductive means comprises:

a second discharging transistor having a conduction path and a control electrode, the conduction path of said second discharging transitor being coupled between the control electrode of said second transistor of said second inverting means and said second power terminal; and second switching means responsive to said output signal, connected to the control electrode of said second discharging transistor, for turning on said second discharging transistor when said input signal makes a transition so as to turn on said first transistor of said second inverting means and for turning off said second discharging transistor a predetermined time later.

4. The level shifter of claim 3 wherein said first switching means comprises:

a first resistive element connected between said second power terminal and the control electrode of said first discharging transistor;

a first switching transistor pair comprising first and second transistors of the same conductivity type, each one of said first and second transistors having a conduction path and a control electrode, the conduction paths of said first and second transistors forming said first switching transistor pair being connected in series between said first power terminal and the control electrode of said first discharging transistors, with the control electrode of the first transistor of said first switching pair connected to said signal input terminal; and first disabling means responsive to said input signal and connected to the control electrode of the second transistor of said first switching pair, for turning off said first switching pair second transistor a predetermined time after said first transistor of said first inverting means turns on; and wherein said second switching means comprises:

a second resistive element connected between said second power terminal and the control electrode of said second discharging transistor;

a second switching transistor pair comprising first and second transistors of the same conductivity type each one of said first and second transistors having a conduction path and a control electrode, the conduction paths of said first and second transistors of said second switching transistor pair being connected in series between said first power terminal and the control electrode of said second discharging transistor, with means applying the complement of said input signal to the control electrode of the first transistor of said second switching pair; and second disabling means responsive to said complement of said input signal, connected to the control electrode of the second transistor of said second switching pair, for turning off said second switching pair second transistor a predetermined time after said first transistor of said second inverting means turns on.

5. The level shifter of claim 4 wherein said first resistive element is a metal oxide semiconductor transistor having a conduction path connected between said second power terminal and said control electrode of said first discharging transistor, and wherein said second resistive element is a metallic oxide semiconductor transistor having a conduction path connected between said second power terminal and said control electrode of said second discharging transistor.

6. A level shifter of claim 4 wherein said first resistive element is an integrated circuit thick film resistor coupled between said second power terminal and said control electrode of said first discharging transistor and wherein said second resistive element is an integrated circuit thick film resistor coupled between said second power terminal and said control electrode of said second discharging transistor.

7. The level shifter of claim 4 wherein said first disabling means comprises:
   a second signal inverter having an input connected to a signal input and an output connected to said first switching pair second transistor input; and
   a first capacitive element connected across said second inverter output and a point of potential; and wherein said second disabling means comprises:
   a third signal inverter having an input coupled to control electrode of the first transistor of said second inverter means and an output connected to said second switching pair second transistor control electrode; and
   a second capacitive element connected between said third inverter output and said point of potential.

8. The level shifter as claimed in claim 4 wherein said first disabling means comprises:
   a first disabling transistor whose conduction path is coupled between said first power terminal and said control electrode of said first switching pair second transistor, with means applying said input signal to its control electrode;
   a first capacitive element connected between said second power terminal and said control electrode of said first switching pair second transistor; and
   a third resistive element connected between said second power terminal and said control electrode of said first switching pair second transistor; and wherein said second disabling means comprises:
   a second disabling transistor whose conduction path is coupled across said first power terminal and said control electrode of said second switching pair second transistor, with means applying the complement of said input signal to its control electrode;
   a second capacitive element connected between said second power terminal and said control electrode of said second switching pair second transistor; and
   a fourth resistive element connected between said second power terminal and said control electrode of said second switching pair second transistor.

9. The level shifter as claimed in claim 1 wherein said first conductive means comprises:
   a first discharging transistor having a conduction path coupled between the control electrode of said second transistor of said first inverting means and said second power terminal; and
   first switching means responsive to said input signal connected to the control electrode of said first discharging transistor, for turning on said first discharing transistor when said first transistor of said first inverting means turns on and for turning off said first discharging transistor when the voltage level applied to the control electrode of said second transistor of said second inverting means is approximately equal to the threshold value of said second transistor of said second inverting means; and wherein said second conductive means comprises:
   a second discharging transistor having a conduction path coupled between said control electrode of said second transistor of said second inverting means and said second power terminal; and
   said switching means responsive to the complement said input signal and being connected to the control electrode of said second discharging transistor, for turning on said second discharging transistor when said first transistor of said second inverting means turns on and for turning off said second discharging transistor when the voltage level applied to the control electrode of said second transistor of said second inverting means is approximately equal to the threshold level of said second transistor of said second inverting means.

10. A level shift circuit comprising:
   first and second power terminals for the application thereto of first and second voltages, respectively
   first and second transistor of one conductivity type and third and fourth transistors of second conductivity type; each transistor having a conduction path and a control electrode;
   first and second output terminals;
   means connecting the conduction paths of said first and second transistors between said first power terminal and said first and second output terminals, respectively.
   means connecting the conduction paths of said third and fourth transistors between said second power terminal and said first and second output terminals, respectively;
   an input terminal for the application thereto of input signals which vary in amplitude between a first value equal to that of said first voltage and a second value intermediate said first and second voltages;
   means coupled between said input terminal and the control electrode of said first transistor for applying thereto said input signals;
   means coupled between said input terminal and the control electrode of said second transistor for applying thereto the complement of said input signals;
   means connecting the control electrode of said third transistor to said second output terminal;
   means connecting the control electrode of said fourth transistor to said first output terminal;
   first conductive means coupled to the control electrode of said third transistor responsive to the signal applied to the control electrode of said first transistor for reducing the conductivity of said third transistor when said first transistor is being turned-on; and
   second conductive means coupled to the control electrode of said fourth transistor responsive to the signal applied to the control electrode of said second transistor for reducing the conductivity of said fourth transistor when said second transistor is being turned-on.

11. The combination as claimed in claim 10 wherein said means coupled between said input transistor and the control electrode of said second transistor is an inverter having an input connected to said input terminal and having an output connected to the control electrode of said second transistor.

12. The combination as claimed in claim 10 wherein said first conductive means is a first capacitive element connected between the control electrodes of said first and third transistors; and wherein said second conductive means is a second capacitive element connected between the control electrodes of said second and fourth transistors.

* * * * *

UNITED STATES PATENT AND TRADEMARK OFFICE
CERTIFICATE OF CORRECTION

PATENT NO. : 4,703,199

DATED : Oct. 27, 1987

INVENTOR(S) : Glenn L. Ely

It is certified that error appears in the above-identified patent and that said Letters Patent is hereby corrected as shown below:

Col. 1, line 55, delete "of" and insert --on--.

Col. 4, line 37, after "towards" insert --$V_{DD}$--.

Col. 9, line 34, delete "tranistor" and insert --transistor--.

Col. 10, line 14, delete "output" and insert --input--.

Col. 11, line 20, delete "input" and insert --control electrode--

Col. 11, lines 64, 65, delete "discharing" and insert
--discharging--.

Signed and Sealed this

Fourteenth Day of June, 1988

*Attest:*

DONALD J. QUIGG

*Attesting Officer*    *Commissioner of Patents and Trademarks*